(12) United States Patent
Lee et al.

(10) Patent No.: US 7,629,738 B2
(45) Date of Patent: Dec. 8, 2009

(54) ORGANIC ELECTROLUMINESCENCE DISPLAY DEVICE PROVIDING UNIFORMITY OF COLOR COORDINATES BY CONTROLLING INORGANIC LAYER THICKNESS DEVIATION

(75) Inventors: Hun-Jung Lee, Anyang-si (KR); Sang-Il Park, Seoul (KR); Sun-Hwa Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/111,833

(22) Filed: Apr. 22, 2005

(65) Prior Publication Data
US 2005/0242716 A1 Nov. 3, 2005

(30) Foreign Application Priority Data
Apr. 29, 2004 (KR) .................. 10-2004-0030211

(51) Int. Cl.
*H01J 1/62* (2006.01)
*H01J 63/04* (2006.01)

(52) U.S. Cl. .................. 313/504; 313/483; 313/500; 313/501; 313/505; 313/506

(58) Field of Classification Search .................. 313/504
See application file for complete search history.

(56) References Cited

U.S. PATENT DOCUMENTS

| | | | |
|---|---|---|---|
| 6,593,691 B2 * | 7/2003 | Nishi et al. | 313/506 |
| 6,740,977 B2 | 5/2004 | Ahn et al. | |
| 2002/0057055 A1 * | 5/2002 | Yamazaki et al. | 313/506 |
| 2003/0146692 A1 * | 8/2003 | Uchida | 313/504 |
| 2004/0018797 A1 * | 1/2004 | Murakami et al. | 445/24 |

\* cited by examiner

*Primary Examiner*—Nimeshkumar D. Patel
*Assistant Examiner*—Natalie K Walford
(74) *Attorney, Agent, or Firm*—H.C. Park & Associates, PLC

(57) ABSTRACT

An organic electroluminescence display device can have uniformity of color coordinates by controlling the thickness of SiNx layer under an organic light-emitting element. Such an organic electroluminescence display device can include a TFT, a passivation layer formed on the TFT, and an organic light-emitting element on the passivation layer. The passivation layer can have a thickness deviation range of about 200 Å or less.

11 Claims, 7 Drawing Sheets

ORGANIC ELECTROLUMINESCENCE DISPLAY DEVICE PROVIDING UNIFORMITY OF COLOR COORDINATES BY CONTROLLING INORGANIC LAYER THICKNESS DEVIATION

CROSS REFERENCE

This application claims the benefit of Korean Patent Application No. 2004-30211, filed on Apr. 29, 2004, which is hereby incorporated herein by reference in its entirety.

BACKGROUND OF THE INVENTION (a) Field of the Invention

The present invention relates to, for example, an organic electroluminescence display device. More particularly, the present invention relates to an organic electroluminescence display device in which uniformity of color coordinates is obtained by controlling the thickness of a SiNx layer under an organic light-emitting element.

(b) Description of Related Art

An organic electroluminescence display device is a light-emitting display device. The mechanism that causes light to emit is the dropping of excitons (created by combination of injected electrons and holes) from an excited state to a ground state. The electrons and holes are typically injected into a light-emitting layer by an electron injection cathode and a hole injection anode.

An organic electroluminescence display device does not require a separate light source. Thus, it may be thinner and lighter than a liquid crystal display.

The organic electroluminescence display device is divided into a passive matrix type organic electroluminescence display device and an active matrix type organic electroluminescence display device depending on its driving method.

Because of high power consumption and scaling difficulties, the passive matrix type organic electroluminescence display device is typically used only for small displays. Active matrix type organic electroluminescence display devices are typically used for displays with a large area.

SiNx is typically used as an insulating layer in an active matrix type organic electroluminescence display device. SiNx can help to provide protection as a passivation layer formed after a thin film transistor (which can be used for driving the organic light-emitting element).

However, the SiNx layer has low light transmittance. It also affects the uniformity of color (spectrum waveform) of light emitted from the organic electroluminescence display device, because there can be large thickness deviations in the layer. The usual reason for these thickness variations is that the layer is generally formed by chemical vapor deposition.

SUMMARY OF THE INVENTION

Accordingly, the present invention provides, for example, an organic electroluminescence display device that includes a thin film transistor (TFT) formed on a substrate, and a passivation layer formed on the substrate with the TFT. The TFT can include an active layer with source/drain regions, a gate electrode formed on a gate insulating layer, and source/drain electrodes coupled to the source/drain regions through contact holes of an interlayer insulating layer. The passivation layer can include via holes for exposing either the source electrode or the drain electrode, and an organic light-emitting element may be coupled to either the source electrode or the drain electrode through at least one of the via holes. The passivation layer can have a thickness deviation range of about 200 Å or less.

DETAILED DESCRIPTION OF THE INVENTION

Figure 1:
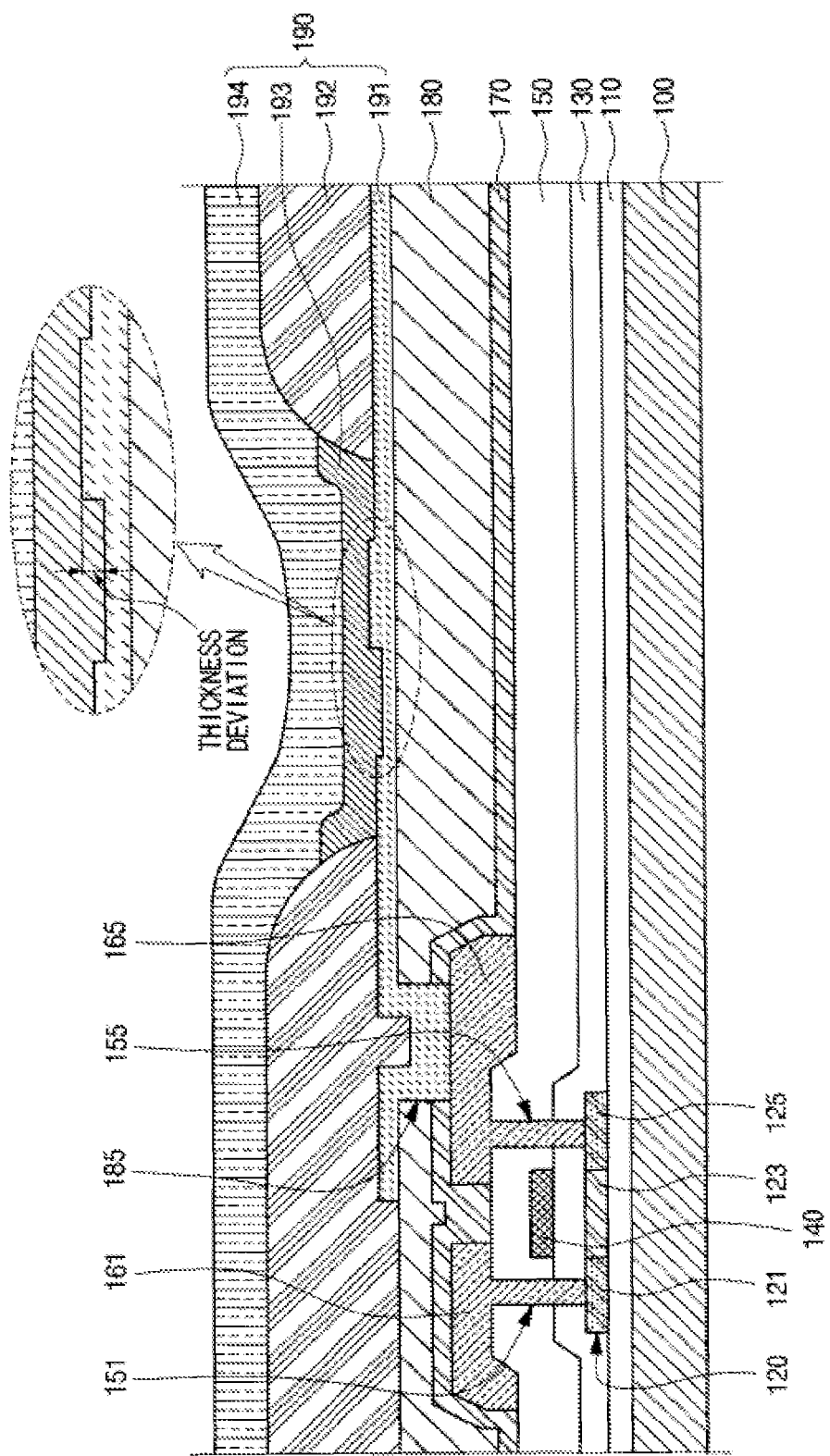
FIG. 1 is a cross sectional view illustrating an organic electroluminescence display device of an embodiment of the present invention.

The present invention will now be described in detail with reference to the accompanying drawings in which example embodiments of the invention are shown. The invention may, however, be embodied in different forms and should not be construed as limited to the embodiments shown and described. The dimensions in the drawings are exaggerated for clarity. The same reference numerals are used to denote the same elements throughout the specification.

FIG. 1 is a cross sectional view illustrating an organic electroluminescence display device of an embodiment of the present invention.

An organic electroluminescence display device of an embodiment of the present invention can have a structure that improves light emitting efficiency by removing material with low light transmittance on light emitting region.

As shown in FIG. 1, a buffer layer 110 for preventing penetration of impurities into the active layer (polycrystalline silicon) generated by diffusion of, for example, metal ions from the insulating substrate 100 can be deposited on an insulating substrate 100. The method used can be, for example, plasma enhanced chemical vapor deposition (PECVD), low pressure chemical vapor deposition (LPCVD), sputtering, or the like.

An amorphous silicon layer may be deposited on the buffer layer 110. The deposition method can, for example, be PECVD, LPCVD, sputtering, or the like. Next, a dehydrogenation process can be performed in a vacuum furnace. The dehydrogenation process can be skipped when the amorphous silicon layer is deposited on the buffer layer 110 by LPCVD or sputtering.

A polycrystalline silicon layer can be formed by crystallizing amorphous silicon using high energy irradiation. Crystallization processes such as excimer laser annealing (ELA), metal induced crystallization (MIC), metal induced lateral crystallization (MILC), sequential lateral solidification (SLS), solid phase crystallization (SPC), and the like can be used as the amorphous silicon crystallization process.

A photoresist for forming the active layer can be formed on the polycrystalline silicon layer, and an active layer 120 can be formed by patterning the polycrystalline silicon layer using the photoresist as a mask.

A gate electrode 140 can be formed by patterning the gate metal after depositing a gate insulating layer 130 on the active layer 120 and depositing gate metal on the gate insulating layer 130.

Source and drain regions 121 and 125 can be formed by doping impurities with selected conductivity on the active layer 120 using the gate electrode 140 as a mask. A region between the source/drain regions 121 and 125 in the active layer functions as channel region 123 of the TFT.

An interlayer insulating layer 150 can be formed over the insulating substrate 100. Contact holes 151 and 155 for exposing a part of the source/drain regions 121 and 125 can be formed by patterning the interlayer insulating layer 150.

Source and drain electrodes 161 and 165 coupled to the source/drain regions 121 and 125 through the contact holes 151 and 155 can be formed by depositing a conductive layer over the insulating substrate 100 and performing photolithography on the conductive layer.

A passivation layer 170 can be formed over the insulating substrate 100. The passivation layer 170 can be formed of SiNx. It can have a thickness deviation range of about 200 Å or less. It may be desirable that it has a thickness deviation range of about 100 Å or less. The reason for the small thickness deviation range is that the larger the thickness deviation range of the passivation layer 170 formed of SiNx, the greater the deterioration of uniformity of color coordinates and spectrum waveform of emitted light.

Heat treatment can be performed on the formed passivation layer to improve characteristics of thin film transistor by curing damage generated in the TFT fabrication process. A planarization layer 180 for removing unevenness in the lower structure can be formed. Materials such as inorganic layers, acryl, polyimide, polyamide and benzocyclobutene that are capable of planarizing the TFT by counteracting its fluidity may be used as the planarization layer 180.

A via hole 185 for exposing a part of either the source electrode or the drain electrode 161 and 165 (for example, the drain electrode 165) can be formed. An organic light-emitting element 190 can be formed coupled to the drain electrode 165 through the via hole 185.

The organic light-emitting element 190 can include a first electrode of a pixel electrode 191, a pixel defining layer 192 on which an opening for exposing a part of the pixel electrode 191 is formed, an organic light-emitting layer 193 formed on the opening, and a second of an upper electrode 194 formed on the front of the insulating substrate 100.

Furthermore, the organic light-emitting layer 193 can include various layers to assist the function of the organic light-emitting layer 193. Generally, the organic light-emitting layer 193 can be constructed in a multilayer structure including a light-emitting layer and at least one hole injection layer (HIL), hole transfer layer (HTL), hole blocking layer (HBL), electron transport layer (ETL), or electron injection layer (EIL). Although not shown in the drawing, an upper substrate can be used to seal the organic light-emitting element 190.

Figure 2:
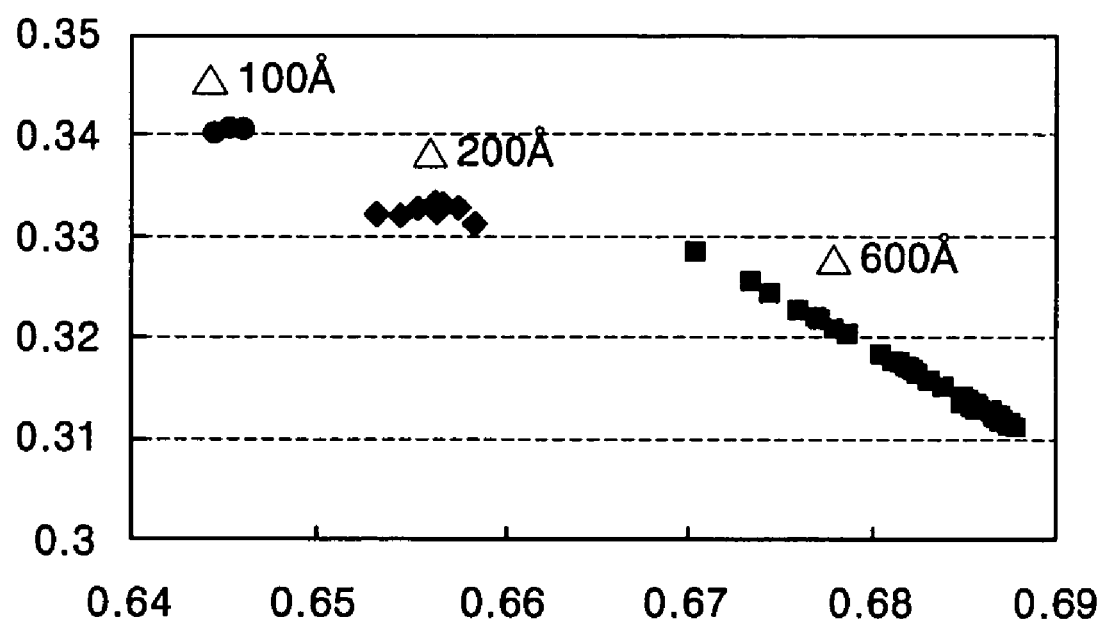
FIG. 2 is a drawing illustrating uniformity of color coordinates of red organic light-emitting element depending on thickness change of passivation SiNx layer with low light transmittance.

As shown in FIG. 2, the red organic light-emitting element experiences less change of color coordinates when a SiNx layer is in the thickness deviation range of about 100 Å compared with a case in which the SiNx layer is in the thickness deviation range of about 200 Å and about 600 Å respectively.

Thus, it can be seen for a red organic light-emitting element that the smaller the thickness deviation range of a SiNx layer, the better the uniformity of color coordinates of light emitted from the organic light-emitting element.

Figure 3A:
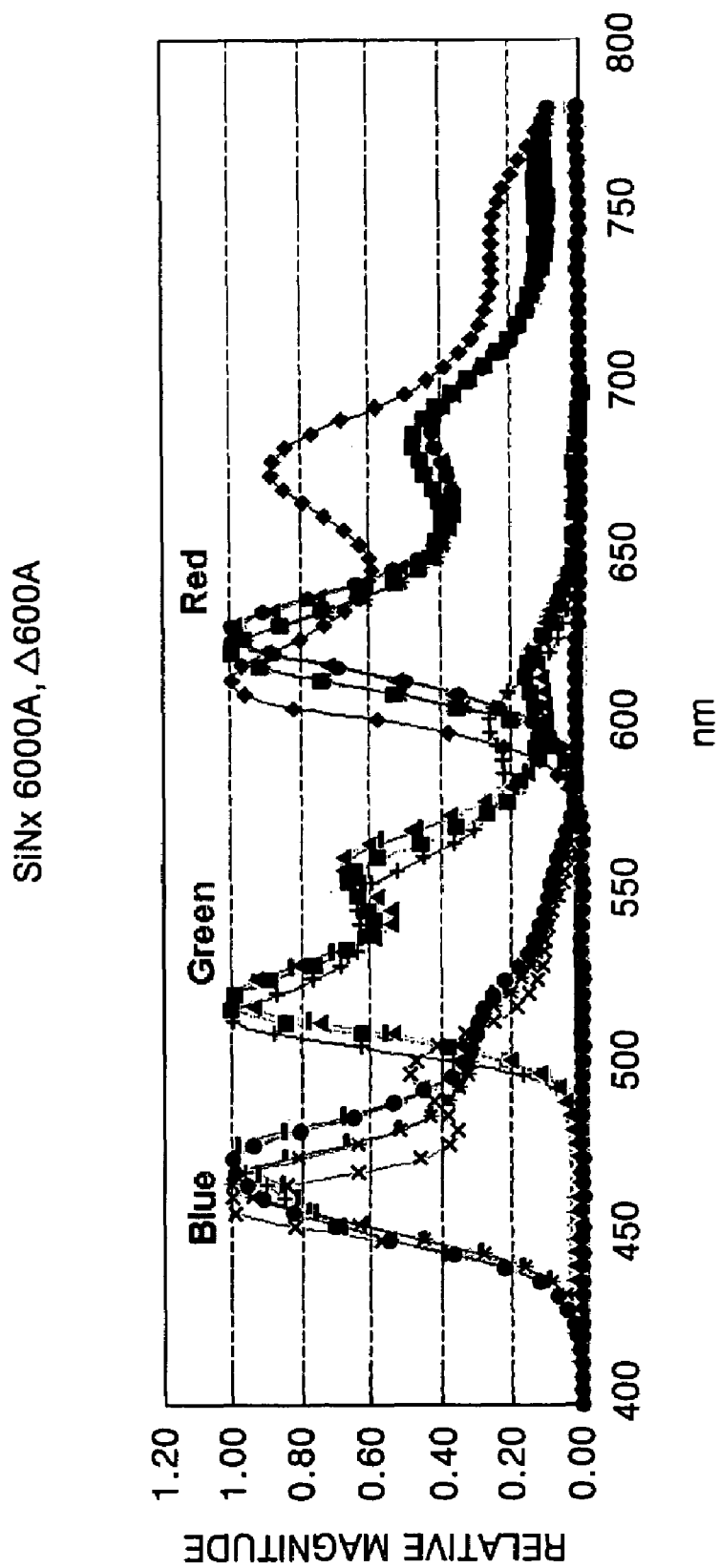
FIG. 3A, FIG. 3B, and FIG. 3C are drawings illustrating uniformity of the spectrum waveform of organic electroluminescence display device depending on the thickness deviation range of SiNx layer with low light transmittance.
Figure 3B:
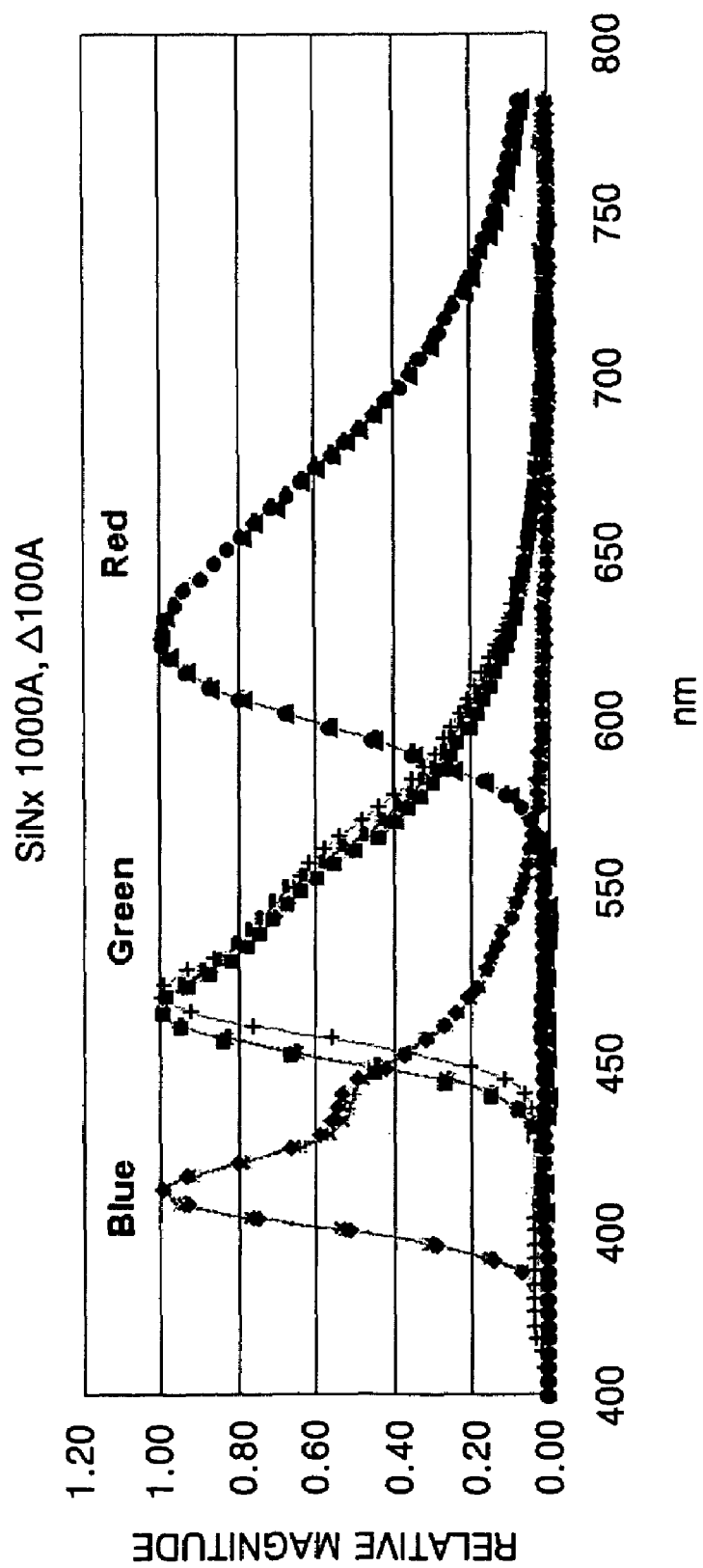
Figure 3C:
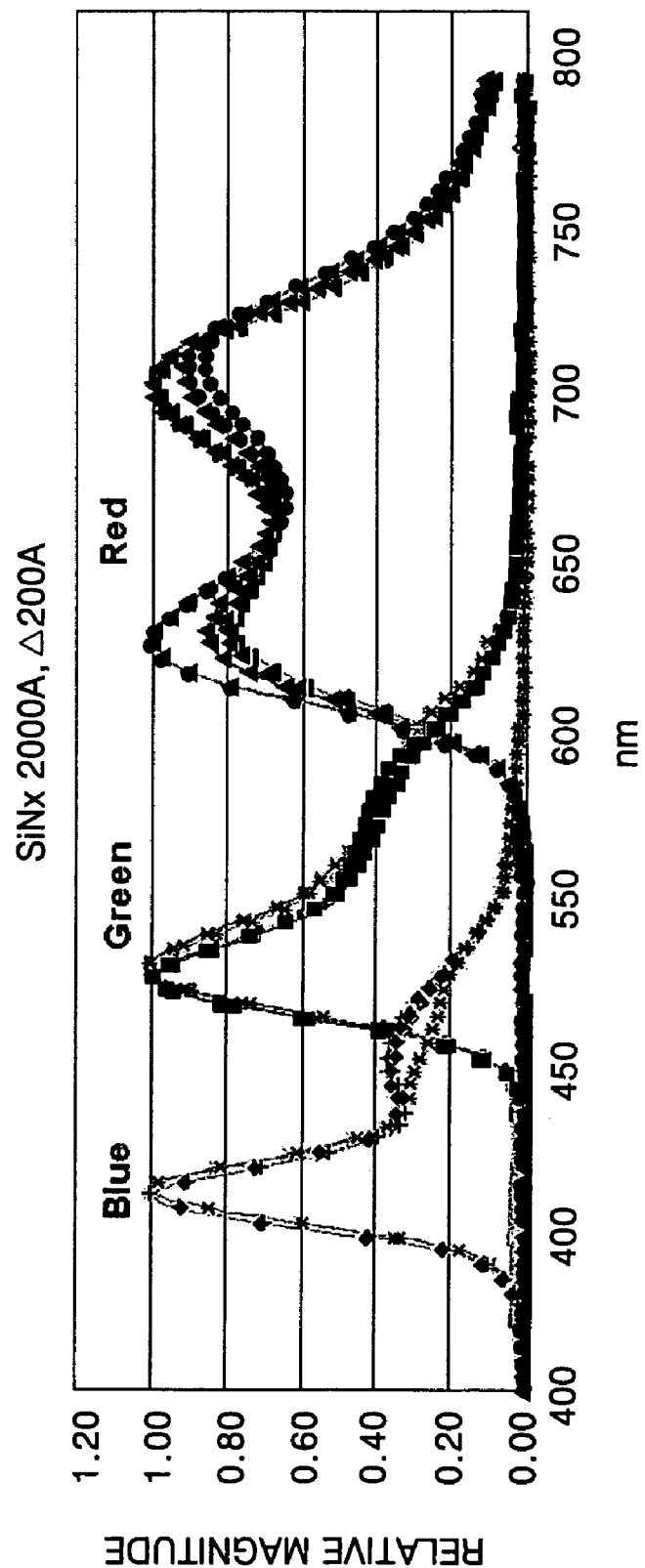

FIG. 3A is a drawing illustrating uniformity of the spectrum waveform when a SiNx layer has thickness of about 6,000 Å in the thickness deviation range of about 600 Å. FIG. 3B is a drawing illustrating uniformity of the spectrum waveform when a SiNx layer has thickness of about 1,000 Å in the thickness deviation range of about 100 Å. FIG. 3C is a drawing illustrating uniformity of the spectrum waveform when a SiNx layer has thickness of about 2,000 Å in the thickness deviation range of about 200 Å.

As shown in FIGS. 3A, 3B, and 3C, the uniformity of the spectrum waveform of light emitted from an organic electroluminescence display device can be superior if the SiNx layer is in the thickness deviation range of about 100 Å or less. Further, the uniformity of the spectrum waveform thereof can be acceptable if the SiNx layer is in the thickness deviation range of about 200 Å or less. Particularly, the uniformity of the spectrum waveform of light emitted from the organic electroluminescence display device can be even more inferior if the SiNx layer is in the thickness deviation range of about 600 Å, as compared to about 200 Å or less.

Therefore, the smaller the thickness deviation range of the SiNx layer is, the more uniform spectrum waveform of light emitted from the organic electroluminescence display device is.

Figure 4A:
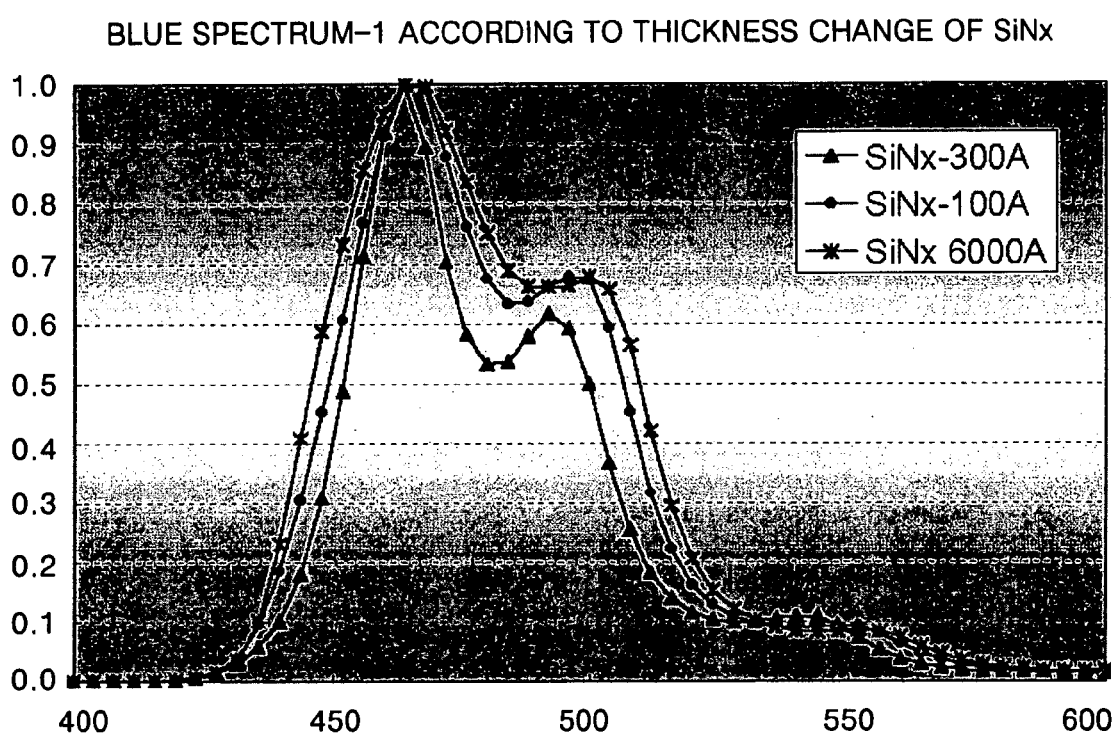
FIG. 4A and FIG. 4B are drawings illustrating change of the spectrum waveform of light emitted from a blue light-emitting organic electroluminescence display device for thickness change of SiNx layer.
Figure 4B:
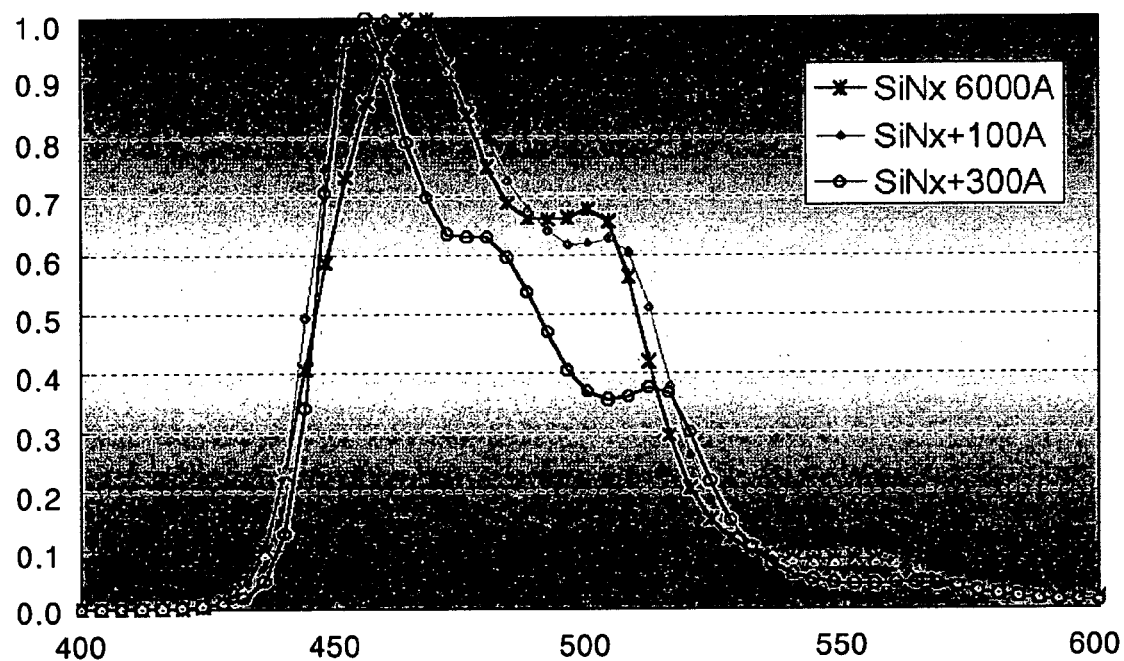

As shown in FIG. 4A and FIG. 4B, change of the spectrum waveform is small when a thickness change of a SiNx layer is about ±100 Å when the layer is about 6,000 Å thick. However, change of the spectrum waveform is large when a thickness change of the layer is about ±300 Å.

Thus, the larger the thickness deviation range of the SiNx layer, the more the spectrum waveform changes. The smaller the thickness deviation range of SiNx layer is, the more uniform color coordinates and spectrum waveform of light emitted are.

Although a passivation layer is exemplified as a SiNx layer, uniformity of color coordinates and emitting spectrum of the organic light-emitting element can be obtained by controlling thickness deviation of the SiNx layer even when the inorganic layer, particularly SiNx layer is formed on at least one of a buffer layer, a gate insulating layer, an interlayer insulating layer, and a planarization layer of a lower part of the organic light-emitting element.

Thus, an organic electroluminescence display device with uniform color coordinates and emitting spectrum can be provided by controlling the thickness deviation of a SiNx layer of a lower part of an organic light-emitting element.

Although the invention has been particularly described with reference to certain embodiments thereof, changes may be made to these embodiments without departing from the scope of the invention.

What is claimed is:

1. An organic electroluminescence display device, comprising:
   a thin film transistor formed on a substrate;
   an organic light emitting element coupled to one of a drain and source electrode of the thin film transistor, the organic light emitting element comprising a first electrode, an organic light emitting layer, and a second electrode; and
   at least one inorganic layer arranged on a top surface of the one of the drain or source electrode, the first electrode being arranged on the at least one inorganic layer,
   wherein the at least one inorganic layer has a thickness deviation of more than zero and about 200 Å or less, and has a via hole to expose a part of either the drain electrode or source electrode,
   wherein the first electrode of the organic light emitting element is coupled to the one of the drain electrode or source electrode through the via hole.

2. The organic electroluminescence display device of claim 1, wherein the inorganic layer is one of a passivation layer and a planarization layer.

3. The organic electroluminescence display device of claim 1, wherein the inorganic layer is silicon nitride.

4. The organic electroluminescence display device of claim 2, wherein the inorganic layer is silicon nitride.

5. The organic electroluminescence display device of claim 1, wherein the thickness deviation is about 100 Å or less.

6. The organic electroluminescence display device of claim 4, wherein the thickness deviation of the inorganic layer is about 100 Å or less.

7. The organic electroluminescence display device of claim 1, wherein the substrate comprises an insulating substrate.

8. An organic electroluminescence display device, comprising:
 a thin film transistor formed on a substrate;
 a passivation layer covering a portion of the thin film transistor; and
 an organic light emitting element coupled to one of a source or drain electrode of the thin film transistor, the organic light emitting element comprising a first electrode;
 wherein the passivation layer is formed of a silicon nitride layer and is arranged on a top surface of the one of the source or drain electrode, the first electrode being arranged on the passivation layer, and
 wherein the silicon nitride layer comprises a thickness deviation of more than zero and about 200 Å or less, and has a via hole to expose a part of either the drain electrode or the source electrode,
 wherein the first electrode of the organic light emitting element is coupled to the one of the drain electrode or source electrode through the via hole.

9. The organic electroluminescence display device of claim 8, further comprising at least one of a passivation layer and a planarization layer comprising silicon nitride.

10. The organic electroluminescence display device of claim 8, wherein the thickness deviation is about 100 Å or less.

11. The organic electroluminescence display device of claim 8, wherein the substrate comprises an insulating layer.

* * * * *